United States Patent
Ikushima

(10) Patent No.: US 11,229,923 B2
(45) Date of Patent: Jan. 25, 2022

(54) WORKING APPARATUS AND WORKING METHOD

(71) Applicant: MUSASHI ENGINEERING, INC., Mitaka (JP)

(72) Inventor: Kazumasa Ikushima, Tokyo (JP)

(73) Assignee: MUSASHI ENGINEERING, INC., Tokyo (JP)

( * ) Notice: Subject to any disclaimer, the term of this patent is extended or adjusted under 35 U.S.C. 154(b) by 133 days.

(21) Appl. No.: 16/331,688

(22) PCT Filed: Sep. 29, 2017

(86) PCT No.: PCT/JP2017/035393
§ 371 (c)(1),
(2) Date: Mar. 8, 2019

(87) PCT Pub. No.: WO2017/062463
PCT Pub. Date: Apr. 5, 2018

(65) Prior Publication Data
US 2019/0193104 A1 Jun. 27, 2019

(30) Foreign Application Priority Data
Sep. 30, 2016 (JP) .............................. JP2016-194424

(51) Int. Cl.
*B05C 5/02* (2006.01)
*H01L 21/67* (2006.01)
(Continued)

(52) U.S. Cl.
CPC ............ *B05C 5/0212* (2013.01); *B05C 11/00* (2013.01); *B05D 1/26* (2013.01); *H01L 21/6708* (2013.01);
(Continued)

(58) Field of Classification Search
USPC .................. 118/300, 313, 315, 305, 679–681
See application file for complete search history.

(56) References Cited

U.S. PATENT DOCUMENTS

| 2006/0165900 A1* | 7/2006 | Edwards .............. B41J 2/04505 |
| | | 427/282 |
| 2007/0009650 A1* | 1/2007 | Cho ...................... B05C 5/0216 |
| | | 427/8 |

(Continued)

FOREIGN PATENT DOCUMENTS

| JP | 2004-290885 A | 10/2004 |
| JP | 2009-050828 A | 3/2009 |

(Continued)

OTHER PUBLICATIONS

English Translation, TW201008664A (Year: 2010).*

(Continued)

*Primary Examiner* — Yewebdar T Tadesse
(74) *Attorney, Agent, or Firm* — Westerman, Hattori, Daniels & Adrian, LLP

(57) ABSTRACT

An apparatus and a method performing work free from variations among a plurality of work heads having individual differences. A working apparatus includes a number n (a natural number 2 or greater) of work heads, a stage retaining a work object, drive devices moving the stage and the work heads relative to each other in three directions, a work amount measurement device measuring a work amount of each work head, and a control device, wherein the first-direction drive device enables the number n of work heads to be independently moved in a first direction, and the second-direction drive device includes a second-direction main drive device moving the number n of work heads simultaneously in a second direction, and a second-direction auxiliary drive device moving n−1 work heads among the (Continued)

number n of work heads independently in the second direction. A working method is carried out using the working apparatus.

20 Claims, 4 Drawing Sheets

(51) Int. Cl.
    *B05C 11/00*     (2006.01)
    *B05D 1/26*     (2006.01)
    *H01L 21/68*     (2006.01)
    *G01C 3/00*     (2006.01)
    *B05C 5/00*     (2006.01)
    *G01B 11/14*     (2006.01)

(52) U.S. Cl.
CPC .... *H01L 21/6715* (2013.01); *H01L 21/67051* (2013.01); *H01L 21/67253* (2013.01); *H01L 21/681* (2013.01); *B05C 5/00* (2013.01); *G01B 11/14* (2013.01); *G01C 3/00* (2013.01)

(56) References Cited

U.S. PATENT DOCUMENTS

| | | |
|---|---|---|
| 2010/0052198 A1 | 3/2010 | Kushima |
| 2012/0125536 A1* | 5/2012 | Morimoto ......... H01L 21/67092 156/297 |
| 2012/0127485 A1* | 5/2012 | Yamauchi ............... H01L 24/81 356/614 |
| 2016/0008835 A1 | 1/2016 | Giusti et al. |
| 2017/0282207 A1 | 10/2017 | Giusti et al. |
| 2019/0001361 A1 | 1/2019 | Giusti et al. |
| 2019/0001362 A1 | 1/2019 | Giusti et al. |
| 2019/0001363 A1 | 1/2019 | Giusti et al. |
| 2019/0070623 A1 | 3/2019 | Giusti et al. |

FOREIGN PATENT DOCUMENTS

| | | | |
|---|---|---|---|
| JP | 2009072648 A | * | 4/2009 |
| JP | 2009072648 A | | 4/2009 |
| KR | 10-2015-0081053 A | | 7/2015 |
| TW | 201008664 A | | 3/2010 |
| WO | 2016/007596 A1 | | 1/2016 |

OTHER PUBLICATIONS

Supplementary European Search Report completion dated Apr. 22, 2020, issued in counterpart EP Application No. 17856412. (1 page).
Office Action dated Oct. 14, 2021, issued in counterpart KR application No. 10-2019-7008422, with English Translation. (11 pages).

* cited by examiner

WORKING APPARATUS AND WORKING METHOD

TECHNICAL FIELD

The present invention relates to a working apparatus including a plurality of work heads, and a working method. More particularly, the present invention relates to a liquid material application apparatus and application method each using a plurality of discharge devices. The term "discharge" used in the present invention includes a discharge type in which a liquid material comes into contact with an application object before the liquid material departs away from a discharge port, and a discharge type in which the liquid material comes into contact with the application object after the liquid material has departed away from the discharge port.

BACKGROUND ART

The so-called "multi-piece processing" of forming a plurality of same-type semiconductor devices in a matrix pattern on a comparatively large-sized substrate, e.g., a rectangular substrate having one side of about 500 mm, and then cutting the substrate into the individual semiconductor devices has been increasingly performed in manufacturing of semiconductor devices, etc. In order to manufacture a large number of semiconductor devices, an improvement of productivity is always demanded. In this Description, the term "productivity" is principally assumed to be the number of semiconductor devices processed per unit time.

The most easy and general method of improving the productivity is to install a plurality of same-type manufacturing apparatuses and to perform parallel processing with those apparatuses. However, that method increases the total size of the manufacturing apparatuses and increases the cost.

In view of the above-described situation, it is tried to improve the productivity by mounting a plurality of work heads to one manufacturing apparatus and making the work heads perform the same work at the same time while the size of the manufacturing apparatus is kept substantially same as before. Regarding a liquid material application apparatus, for example, the following techniques of mounting a plurality of discharge devices as the work heads are disclosed.

Patent Document 1 discloses an application apparatus of drawing a desired pattern on an application object by discharging an application material onto the application object from a nozzle of application means, wherein the application apparatus includes a plurality of application means, a moving mechanism moving the application object in accordance with a drawing form of the application material, and control means individually controlling amounts of the application material applied from the plurality of application means.

Patent Document 2 discloses a paste application apparatus comprising an application head discharging a paste toward an application object from a nozzle with rotation of a screw in an amount depending on a rotational speed of the screw, a moving mechanism moving the application object and the application head relative to each other, a detector detecting the amount of the paste applied onto the application object, and means adjusting a relative moving speed between the application object and the application head or the rotational speed of the screw on the basis of the detected application amount to obtain a target application amount, and controlling the application head and the moving mechanism in accordance with the adjusted relative moving speed or the adjusted rotational speed.

CITATION LIST

Patent Documents

Patent Document 1: Japanese Patent Laid-Open Publication No. 2004-290885
Patent Document 2: Japanese Patent Laid-Open Publication No. 2009-50828

SUMMARY OF INVENTION

Technical Problem

However, it is difficult to obtain exactly the same discharge amount of a liquid material among a plurality of discharge devices by setting the conditions of the discharge devices, particularly the conditions of components, operations, etc. of the discharge devices and the conditions of temperature, viscosity, etc. of the discharged liquid material, to be exactly the same. Even if some error is allowable, a difficulty increases in obtaining the same discharge amount because the allowable error is very small with increasing demands for further miniaturization and higher accuracy in recent years. Thus, even when the discharge devices are operated so as to simultaneously perform the same work under the above-described situation, variations generate in the discharge amounts. Accordingly, variations further generate in the application amounts that are results of discharging the liquid material to the application object with the operations of the discharge devices. It can be said that such a problem arises in any types of working apparatuses including a plurality of work heads having individual differences.

In consideration of the above point, an object of the present invention is to provide a working apparatus and a working method capable of performing work free from variations among a plurality of work heads having individual differences. In particular, an object of the present invention is to provide a liquid material application apparatus and application method capable of, even when a plurality of discharge devices having variations in discharge amounts are operated to form the same application pattern, obtaining an application amount free from variations among the plurality of discharge devices.

Solution to Problem

[First Technical Concept]
A working apparatus according to the present invention comprises a number n (where n is a natural number equal to 2 or greater) of work heads performing the same work, a stage retaining a work object, a first-direction drive device moving the stage and the number n of work heads relative to each other in a first direction, a second-direction drive device moving the stage and the number n of work heads relative to each other in a second direction orthogonal to the first direction, a third-direction drive device moving the stage and the number n of work heads relative to each other in a third direction orthogonal to both the first direction and the second direction, a work amount measurement device measuring a work amount of each work head, and a control device controlling operations of the number n of work heads and the first- to third-direction drive devices, wherein the first-direction drive device enables the number n of work heads to be independently moved in the first direction, and the second-direction drive device includes a second-direction main drive device moving the number n of work heads simultaneously in the second direction, and a second-direction auxiliary drive device moving n−1 work heads among the number n of work heads independently in the second direction.

In the above working apparatus, a distance through which the second-direction auxiliary drive device is movable may be not more than half of a distance L through which the second-direction main drive device is movable.

In the above working apparatus, a distance through which the second-direction auxiliary drive device is movable may be not more than ⅕ of a distance L through which the second-direction main drive device is movable.

In the above working apparatus, the first-direction drive device may include a first-direction main drive device moving the number n of discharge devices simultaneously in the first direction, and a first-direction auxiliary drive device moving n−1 discharge devices among the number n of discharge devices independently in the first direction.

In the above working apparatus, the first-direction drive device may be constituted by a number n of first-direction main drive devices moving the number n of discharge devices independently in the first direction in a one-to-one relation.

In the above working apparatus, in a process of controlling the number n of work heads to operate in the same work pattern, the control device may have function of setting a number of operations, a working time, and a working speed for each of the number n of work heads.

In the above working apparatus, in the process of controlling the number n of work heads to operate in the same work pattern, the control device may have function of calculating and setting the number of operations, the working time, and a relative moving speed for each of the number n of work heads on the basis of a value measured by the work amount measurement device for each of the number n of work heads.

In the above working apparatus, in the process of controlling the number n of work heads to operate in the same work pattern, the control device may have function of calculating and setting the number of operations, the working time, and the relative moving speed for each of the number n of work heads without changing an operation frequency.

The above working apparatus may further comprise an image capturing device mounted in association with each of the first-direction drive device and the second-direction drive device, and the control device may have function of calculating positional relations between the number n of work heads and the work object in the first direction and the second direction on the basis of images captured by the image capturing device, and setting work start positions of the number n of work heads in the first direction and the second direction on the basis of results of the calculation.

The working apparatus may further comprise a distance measuring device mounted in association with each of the first-direction drive device and the second-direction drive device, and the control device may have function of calculating a distance between each of the work heads and the work object on the basis of a signal received from the distance measuring device, and setting a work start position of the work head in the third direction on the basis of a result of the calculation.

In the above working apparatus, the work heads may be each a work head mounting a discharge device that discharges a liquid material from a discharge port.

A working method according to the present invention based on a first aspect is a working method using the above-described working apparatus, the working method comprising steps of moving the number n of work heads independently in the first direction by the first-direction drive device, moving the number n of work heads simultaneously in the second direction by the second-direction main drive device, and moving the n−1 work heads among the number n of work heads independently in the second direction by the second-direction auxiliary drive device, thus performing work while the number n of work heads and the work object are moved relative to each other.

A working method according to the present invention based on a second aspect is a working method of forming a number n×m (where m is a natural number equal to 1 or more) of work patterns on the work object by using the above-described working apparatus, wherein the work heads are each a work head mounting a discharge device that discharges a liquid material from a discharge port, and wherein the working method comprises a number-of-discharges calculation step of calculating, on the basis of weight of one droplet discharged by each of the number n of work heads, a number of discharges required to form one work pattern for each of the number n of work heads, an application time calculation step of calculating, on the basis of the calculated number of discharges required to form the one work pattern, a time required to form the one work pattern for each of the number n of work heads, a corrected moving speed calculation step of calculating, on the basis of the calculated time required to form the one work pattern, a corrected moving speed for each of the number n of work heads, and an application step of applying the liquid material while moving the number n of work heads and the work object relative to each other in accordance with the corrected moving speeds having been calculated.

A working method according to the present invention based on a third aspect is a working method of forming work patterns, which are m time(s) (where m is a natural number equal to 1 or more) the number of discharge devices, on the work object by using the above-described working apparatus, wherein the work heads are each a work head mounting a discharge device that discharges a liquid material from a discharge port, and wherein the working method comprises a number-of-discharges calculation step of calculating, on the basis of weight of one droplet discharged by each of the number n of work heads, a number of discharges required to form one work pattern for each of the number n of work heads, an application time calculation step of calculating, on the basis of the calculated number of discharges required to form the one work pattern, a time required to form the one work pattern for each of the number n of work heads, a corrected moving speed calculation step of calculating, on the basis of the calculated time required to form the one work pattern, a corrected moving speed for each of the number n of work heads, a horizontal start position calculation step of calculating horizontal application start positions of the work heads, and an application step of applying the liquid material while moving the number n of work heads and the work object relative to each other in accordance with the corrected moving speeds and the corrected moving speeds both having been calculated.

In the above working method comprising the application step, the number n of work heads may be moved at different moving speeds in the application step by combining operation of the second-direction main drive device and operation of the second-direction auxiliary drive device with each other.

In the above working method based on the second or third aspect, a number n×p (where p is a natural number equal to 2 or more) of arrayed work patterns are formed on the work object.

[Second Technical Concept]

A liquid material application apparatus according to the present invention comprises a number n (where n is a natural number equal to 2 or greater) of discharge devices having the same specifications and each discharging a liquid material from a discharge port, a stage retaining an application object, a first-direction drive device moving the stage and the number n of discharge devices relative to each other in a first direction, a second-direction drive device moving the stage and the number n of discharge devices relative to each other in a second direction orthogonal to the first direction, a third-direction drive device moving the stage and the number n of discharge devices relative to each other in a third direction orthogonal to both the first direction and the second direction, a weight measurement device measuring weight of the liquid material discharged from each discharge device under predetermined conditions, and a control device controlling operations of the number n of discharge devices and the first- to third-direction drive devices, wherein the first-direction drive device enables the number n of discharge devices to be independently moved in the first direction, and the second-direction drive device includes a second-direction main drive device moving the number n of discharge devices simultaneously in the second direction, and a second-direction auxiliary drive device moving n−1 discharge devices among the number n of discharge devices independently in the second direction.

In the above liquid material application apparatus, a distance through which the second-direction auxiliary drive device is movable may be not more than half of a distance L through which the second-direction main drive device is movable.

In the above liquid material application apparatus, a distance through which the second-direction auxiliary drive device is movable may be not more than ⅕ of a distance L through which the second-direction main drive device is movable.

In the above liquid material application apparatus, the first-direction drive device may include a first-direction main drive device moving the number n of discharge devices simultaneously in the first direction, and a first-direction auxiliary drive device moving n−1 discharge devices among the number n of discharge devices independently in the first direction. Alternatively, the first-direction drive device may be constituted by a number n of first-direction main drive devices moving the number n of discharge devices independently in the first direction in a one-to-one relation.

In the above liquid material application apparatus, in a process of controlling the number n of discharge devices to form the same application pattern, the control device may have function of setting a number of discharges, an application time, and an application speed for each of the number n of discharge devices.

In the above liquid material application apparatus in which the control device has the function of setting the number of discharges, the application time, and the application speed, in the process of controlling the number n of discharge devices to form the same application pattern, the control device may have function of calculating and setting the number of discharges, the application time, and the application speed for each of the number n of discharge devices on the basis of a value measured by the weight measurement device for each of the number n of discharge devices. Furthermore, in the process of controlling the number n of discharge devices to form the same application pattern, the control device may have function of calculating and setting the number of discharges, the application time, and the application speed for each of the number n of discharge devices without changing an discharge frequency.

The above liquid material application apparatus may further comprise an image capturing device mounted in association with each of the first-direction drive device and the second-direction drive device, and the control device may have function of calculating positional relations between the number n of discharge devices and the application object in the first direction and the second direction on the basis of images captured by the image capturing device, and setting application start positions of the number n of discharge devices in the first direction and the second direction on the basis of results of the calculation. The liquid material application apparatus may further comprise a distance measuring device mounted in association with each of the first-direction drive device and the second-direction drive device, and the control device may have function of calculating a distance between each of the discharge devices and the application object on the basis of a signal received from the distance measuring device, and setting an application start position of the discharge device in the third direction on the basis of a result of the calculation.

An application method according to the present invention based on a first aspect is an application method using the above-described liquid material application apparatus, the application method comprising steps of moving the number n of discharge devices independently in the first direction by the first-direction drive device, moving the number n of discharge devices simultaneously in the second direction by the second-direction main drive device, and moving the n−1 discharge devices among the number n of discharge devices independently in the second direction by the second-direction auxiliary drive device, thus applying the liquid material while the number n of discharge devices and the application object are moved relative to each other.

An application method according to the present invention based on a second aspect is an application method of forming a number n×m (where m is a natural number equal to 1 or more) of application patterns on the application object by using the above-described liquid material application apparatus, wherein the application method comprises a number-of-discharges calculation step of calculating, on the basis of weight of one droplet discharged by each of the number n of discharge devices, a number of discharges required to form one application pattern for each of the number n of discharge devices, an application time calculation step of calculating, on the basis of the calculated number of discharges required to form the one application pattern, a time required to form the one application pattern for each of the number n of discharge devices, a corrected moving speed calculation step of calculating, on the basis of the calculated time required to form the one application pattern, a corrected moving speed for each of the number n of discharge devices, and an application step of applying the liquid material while moving the number n of discharge devices and the application object relative to each other in accordance with the corrected moving speeds having been calculated.

An application method according to the present invention based on a third aspect is an application method of forming application patterns, which are m time(s) (where m is a natural number equal to 1 or more) the number of discharge devices, on the application object by using the above-described liquid material application apparatus including the image capturing device, wherein the application method comprises a number-of-discharges calculation step of calculating, on the basis of weight of one droplet discharged by each of the number n of discharge devices, a number of discharges required to form one application pattern for each of the number n of discharge devices, an application time calculation step of calculating, on the basis of the calculated number of discharges required to form the one application pattern, a time required to form the one application pattern for each of the number n of discharge devices, a corrected moving speed calculation step of calculating, on the basis of the calculated time required to form the one application pattern, a corrected moving speed for each of the number n of discharge devices, a horizontal start position calculation step of calculating horizontal application start positions of the discharge devices, and an application step of applying the liquid material while moving the number n of discharge devices and the application object relative to each other in accordance with the corrected moving speeds and the corrected moving speeds both having been calculated.

In the above application method comprising the application step, the number n of discharge devices may be moved at different moving speeds in the application step by combining operation of the second-direction main drive device and operation of the second-direction auxiliary drive device with each other.

In the above application method based on any of the first to third aspects, a number n×p (where p is a natural number equal to 2 or more) of arrayed application patterns are formed on the application object.

Advantageous Effects of Invention

According to the present invention, the working apparatus and the working method capable of performing work free from variations among the plurality of work heads having individual differences can be provided. In particular, even when a plurality of discharge devices having variations in discharge amounts are operated to form the same application pattern, an application amount free from variations among the plurality of discharge devices can be obtained.

DESCRIPTION OF EMBODIMENTS

A working apparatus according to the present invention includes a number n (where n is a natural number equal to 2 or greater) of work heads performing the same work, a stage retaining a work object, a first-direction drive device moving the stage and the number n of work heads relative to each other in a first direction, a second-direction drive device moving the stage and the number n of work heads relative to each other in a second direction orthogonal to the first direction, a third-direction drive device moving the stage and the number n of work heads relative to each other in a third direction orthogonal to both the first direction and the second direction, a work amount measurement device measuring a work amount of each work head, and a control device controlling operations of the number n of work heads and the first- to third-direction drive devices.

The first-direction drive device enables the number n of work heads to be independently moved in the first direction. The second-direction drive device includes a second-direction main drive device moving the number n of work heads simultaneously in the second direction, and a second-direction auxiliary drive device moving n−1 work heads among the number n of work heads independently in the second direction. A distance through which the second-direction auxiliary drive device is movable is preferably not more than half, more preferably not more than ⅕, of a distance L through which the second-direction main drive device is movable.

The first-direction drive device may include a first-direction main drive device moving the number n of discharge devices simultaneously in the first direction, and a first-direction auxiliary drive device moving n−1 discharge devices among the number n of discharge devices independently in the first direction. Alternatively, the first-direction drive device may be constituted by a number n of first-direction main drive devices moving the number n of discharge devices independently in the first direction in a one-to-one relation.

With the working apparatus having the above-described features according to the present invention, when a plurality of devices having different "outputs" per unit time are used to simultaneously perform the same work while work heads and a work object are moved relative to each other, final "output results" can be made uniform by individually controlling moving speeds of the work heads. Devices mounted to the work heads are, for example, discharge devices each discharging a liquid material from a discharge port, or laser oscillation devices each emitting a laser beam in the pulse form.

Embodiments for carrying out the present invention will be described below with reference to the drawings.

First Embodiment

<Constitution>

Figure 1:
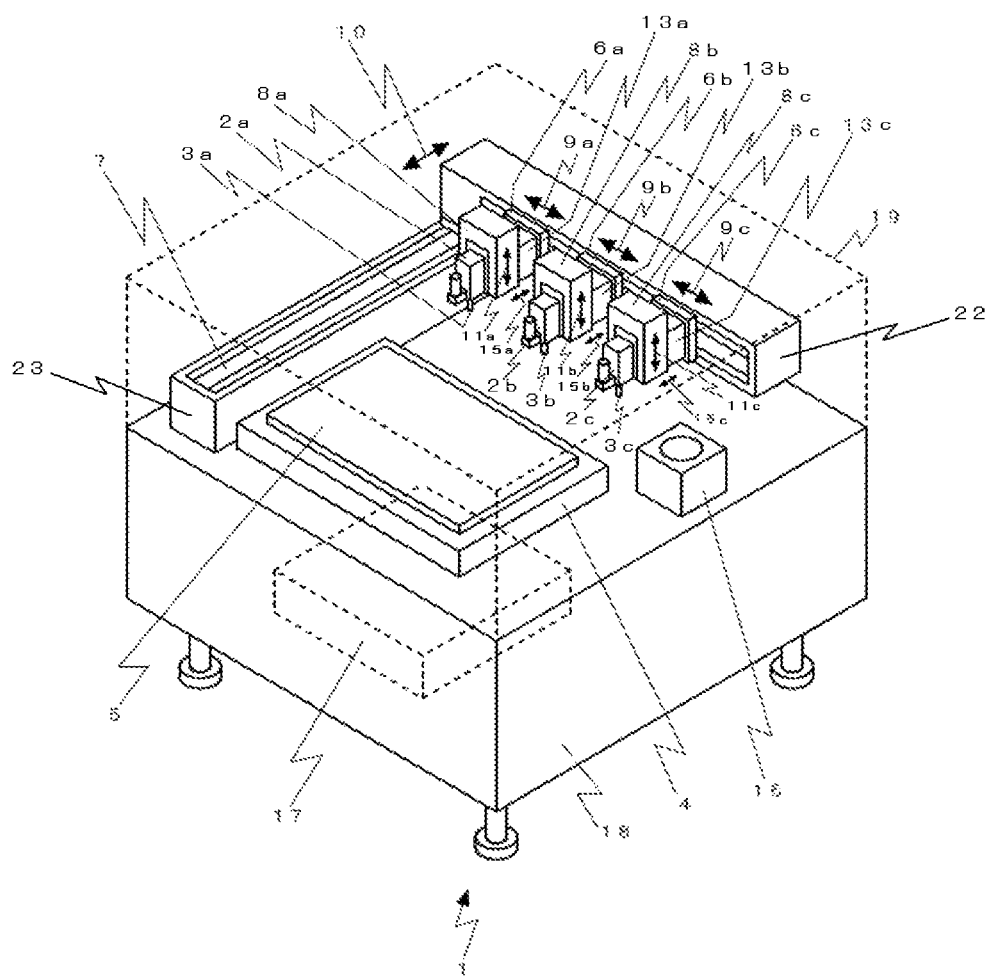
FIG. 1 is an overall perspective view of a liquid material application apparatus according to a first embodiment.

A liquid material application apparatus 1 according to a first embodiment mainly includes, as illustrated in FIG. 1, discharge devices (2a, 2b and 2c) each discharging a liquid material, a stage 4 on which an application object 5 is fixedly placed, XYZ drive devices (6, 7, 8 and 13) moving the discharge devices (2a, 2b and 2c) and the stage 4 relative to each other, a weight measurement device 16 measuring a discharge amount (i.e., a work amount) from each of the discharge devices (2a, 2b and 2c), and a control device 17 connected to the discharge devices (2a, 2b and 2c), the XYZ drive devices (6, 7, 8 and 13), and the weight measurement device 16, and controlling operations of those devices. In the following description, the discharge devices (2a, 2b and 2c) are simply expressed by the "discharge devices 2" in some cases.

The discharge device 2 used in the first embodiment is of the so-called "jet type" in which a liquid material is discharged in the form of droplets from a discharge port 3 by the action of a valve member (rod) that is reciprocally moved in a liquid chamber and that has a narrower width than the liquid chamber. The jet type is classified into a seating jet type in which the valve member is collided against a valve seat, thus causing the liquid material to be discharged in the form of flying droplets from the discharge port, and (b) a non-seating jet type in which the valve member is moved and then abruptly stopped, thus causing the liquid material to be discharged in the form of flying droplets from the discharge port without colliding the valve member (discharge member) against the valve seat. Either one of those two jet types can be optionally used. A drive device for the valve member (rod) may be of, for example, the type including a piston and driving the rod by compressed gas or a spring, or the type driving the rod by a piezoelectric element.

In the first embodiment, because the application object 5 is a multi-piece substrate, the plurality of discharge devices 2 having the same specifications are disposed to be able to form a plurality of application patterns (work patterns) at the same time. FIG. 1 illustrates, by way of example, the case that three discharge devices 2 are disposed. However, the number of discharge devices 2 is not limited to three, and it may be two or four or more (e.g., any of 2 to 8). The number of discharge devices 2 is determined in consideration of the number and the size of application patterns to be formed on the application object. It is disclosed here that, for example, when the number of application patterns is k and a relation of k=n×p (where n and p are each a natural number equal to 2 or greater) is held, the number of discharge devices 2 is set to n or p. In that case, an arrangement of the number k of application patterns formed on the substrate is not limited to a matrix array of n columns×p rows or p columns×n rows, and it may be 2n columns×½p rows, for example. When the plurality of application patterns are arrayed at a narrower pitch (interval) than a width of the discharge device 2 in a row direction (first direction in the first embodiment), application work for one row is performed by a plurality of application operations with the plurality of discharge devices (for example, six application patterns arrayed in one row are formed by two application operations with three discharge devices). Regarding a column direction (second direction in the first embodiment), application is not affected by the magnitude of the interval of the application patterns in the column direction because the discharge device 2 can be moved at a narrower interval than the width of the discharge device 2.

The stage 4 includes an upper flat surface on which the application object 5 is placed, and a fixing mechanism for fixing the application object 5 to the stage 4. The fixing mechanism may be constituted, by way of example, as a mechanism in which a plurality of holes are formed to be communicated with the upper surface from the inside of the stage 4, and the application object 5 is sucked to be fixed by sucking air through the holes, or a mechanism in which the application object 5 is sandwiched between fixing members, and the application object 5 is fixed by securing the fixing members to the stage 4 by fastening means such as screws.

The XYZ drive devices include first-direction main drive devices (6a, 6b and 6c), a second-direction main drive device 7, third-direction drive devices (8a, 8b and 8c), and second-direction auxiliary drive devices (13a, 13b and 13c). In the following description, the first-direction main drive devices (6a, 6b and 6c), the third-direction drive devices (8a, 8b and 8c), and the second-direction auxiliary drive devices (13a, 13b and 13c) are simply expressed by the "first-direction main drive devices 6", the "third-direction drive devices 8", and the "second-direction auxiliary drive devices 13, respectively, in some cases.

The first-direction main drive devices 6 are disposed in the same number as the discharge devices 2, and can move the discharge devices 2 independently in an X direction (denoted by sign 9), i.e., the first direction. The first-direction main drive devices 6a, 6b and 6c are disposed on a lateral surface of a rectangular parallelepiped beam 22 on the side facing the stage so as to move on the same linear path. The second-direction auxiliary drive devices 13a, 13b and 13c are disposed respectively on lateral surfaces of the first-direction main drive devices 6a, 6b and 6c on the side facing the stage. The first-direction main drive devices 6a, 6b and 6c can be operated like one X-direction drive device by controlling those drive devices to simultaneously move at the same speed while constant intervals are kept therebetween.

The second-direction main drive device 7 is constituted to move the first-direction main drive devices 6a, 6b and 6c at the same time in a Y direction (denoted by sign 10), i.e., the second direction, orthogonal to the X direction (denoted by sign 9). The second-direction main drive device 7 is disposed on an upper surface of a long support stand 23, and one end portion of the beam 22 on which the first-direction main drive devices 6a, 6b and 6c are disposed is positioned above the second-direction main drive device 7. With the second-direction main drive device 7 simultaneously moving the first-direction main drive devices 6a, 6b and 6c in the Y direction (denoted by sign 10), the discharge devices 2a, 2b and 2c are simultaneously positioned in their Y-coordinates. Although, in this embodiment, the first direction is defined as the X direction and the second direction is defined as the Y direction, the first direction may be defined as the Y direction and the second direction may be defined as the X direction unlike this embodiment.

The third-direction drive devices 8 are disposed in the same number as the discharge devices 2, and can move the discharge devices 2 independently in a Z direction (denoted by sign 11), i.e., a third direction, orthogonal to both the X direction (denoted by sign 9) and the Y direction (denoted by sign 10). The discharge devices 2a, 2b and 2c are coupled respectively to lateral surfaces of the third-direction drive devices 8a, 8b and 8c on the side facing the stage, and lateral surfaces of the third-direction drive devices 8a, 8b and 8c on the side oppositely away from the stage are coupled respectively to the second-direction auxiliary drive devices 13a, 13b and 13c.

The second-direction auxiliary drive devices 13a, 13b and 13c can individually control moving speeds of the discharge devices 2a, 2b and 2c in the Y direction as denoted by sign 15. The movement in the Y direction as denoted by sign 15 can be performed independently of the movement in the Y direction (denoted by sign 10) by the second-direction main drive device 7. The reason why auxiliary drive devices are not disposed in the first direction (X direction) in the first embodiment is that the first-direction main drive devices 6a, 6b and 6c are originally constituted to be able to move independently. When the discharge devices 2a, 2b and 2c are constituted to be simultaneously moved in the first direction (X direction) as in a later-described third embodiment, first-direction auxiliary drive devices are disposed individually.

A distance through which the second-direction auxiliary drive device 13 is movable is set to be much shorter than a distance L through which the second-direction main drive device 7 is movable. The movable distance of the second-direction auxiliary drive device 13 is, for example, not more than a half, preferably not more than ⅕, and more preferably not more than 1/10 of the movable distance L. Because the second-direction auxiliary drive devices 13a, 13b and 13c constitute application heads together with the discharge devices 2a, 2b and 2c, their sizes are preferably as small as possible. The reason is that, with the size reduction, loads of the drive devices can be reduced and positioning accuracy can be increased. As described later, one of the discharge devices 2 is used to serve as a reference for control of the moving speed, and the second-direction auxiliary drive device 13 coupled to the discharge device 2 serving as the reference is not driven. Alternatively, unlike the example illustrated in FIG. 1, the second-direction auxiliary drive device 13 may not be disposed on the discharge device 2 serving as the reference.

The XYZ drive devices (6, 7, 8 and 13) can be each constituted using a linear motor, a combination of a ball screw and an electric motor (such as a servomotor or a stepping motor), etc. Although, in FIG. 1, the stage 4 is kept fixed and the discharge devices 2 are moved in the X direction (denoted by sign 9) and the Y direction (denoted by sign 10), it is also possible, for example, to move the discharge devices 2 in the X direction (denoted by sign 9) and the stage 4 in the Y direction (denoted by sign 10), or to fix the discharge devices 2 to an inverted-U shaped frame straddling the stage 4, and to move the stage in the X direction (denoted by sign 9) and the Y direction (denoted by sign 10).

In this embodiment, the weight measurement device 16 serving as a work amount measurement device is provided by a device for measuring the weight of the liquid material discharged from the discharge device 2. Because a result measured by the weight measurement device 16 is used for control, the weight measurement device 16 preferably has the function of outputting the measured result to an external device via a cable, etc. For example, an electronic scale is suitably used as the weight measurement device 16.

The control device 17 includes a processing device, a storage device, an input device, and an output device. The control device 17 is connected to the discharge devices 2, the XYZ drive devices (6, 7, 8 and 13), and the weight measurement device 16, and it controls the operations of those devices. For example, a personal computer (PC) or a programmable logic controller (PLC) can be used as the processing device and the storage device. A keyboard, a mouse, a display, and a touch panel for inputting and outputting can be used as the input device and the output device.

The above-described devices are disposed on and inside a bench 18. A space above the bench 18 on which the discharge devices 2, the stage 4, the drive devices (6, 7, 8 and 13), and the weight measurement device 16 are disposed is preferably covered with a cover 19 denoted by dotted lines. The cover 19 can prevent dust from coming into the application apparatus 1 and causing a malfunction of the apparatus or a failure of the product, and can keep an operator from accidentally touching movable components such as the XYZ drive devices (6, 7, 8 and 13). For convenience of the work, an openable door may be provided in a lateral surface of the cover 19.

<Operations>

Operations in the case of using a jet discharge device as each of the discharge devices 2 and applying the liquid material to draw a line by moving the discharge device 2 while continuously discharging the liquid material in the form of flying droplets will be described below by way of example.

(Initial Setting)

At the outset, as a first step, various parameters are input through the input device and are stored in the storage device. The various parameters are related to the application object 5, the discharge device 2, and the application. The parameters related to the application object 5 are the dimensions of the application object 5 itself, the number of multiple pieces formed in the application object 5 (namely the number of multiple pieces arrayed in lengthwise and widthwise directions), the coordinates and images of alignment marks serving as reference positions in execution of the application, etc. The parameters related to the discharge device 2 are a rod ascending time (ON time), a rod descending time (OFF time), the magnitude of pressure when compressed gas is additionally used to feed the liquid material under pressure, etc. The parameters related to the discharge devices 2 are input for all of the plurality of discharge devices 2. The parameters related to the application are the length and the shape of each line to be applied (i.e., the application pattern), the weight of the liquid material (i.e., the application amount) required to form one application pattern, etc.

(Measurement of Weight of Discharged Liquid Material)

Then, as a second step, the discharge amount from each of the discharge devices 2a, 2b and 2c is measured. The discharge amount measured in this embodiment is obtained as a value measured by the weight measurement device 16 when the discharge device 2 performs the discharge in a predetermined number of times (e.g., a preset number of discharges, such as 100 or 500) (namely, obtained as the weight of the liquid material discharged in the preset number of times). That measurement is executed with the discharge device 2 discharging the liquid material in the predetermined number of times at a position above the weight measurement device 16. The measured value is sent to the control device 17 and is stored in the storage device with the aid of dedicated software incorporated in the control device 17.

(Calculation of Corrected Moving Speed)

Then, as a third step, a corrected moving speed for each of the discharge devices 2a, 2b and 2c is calculated on the basis of a measured result of the discharge amount that has been measured in the second step. In this embodiment, the calculation is performed in accordance with the following procedures. The following procedures can be executed using dedicated software incorporated in the control device 17.

(1) The discharge amount per discharge (i.e., the weight of one droplet) is calculated by dividing the weight of the liquid material discharged in the preset number of discharges, which has been measured in the second step, by the preset number of discharges, which has been used in the second step.

(2) The number S of discharges required to form one application pattern is calculated by dividing the weight of the liquid material (i.e., applied liquid weight) required to form one application pattern, which has been set in the first step, by the discharge amount per discharge, which has been calculated in (1).

(3) A time (application time $T_2$) required to form one application pattern is calculated by dividing the number S of discharges required to form one application pattern, which has been calculated in (2), by a discharge frequency (=reciprocal of $T_1$) of the discharge device 2 determined from a discharge time $T_1$ per discharge, which has been set in the first step.

(4) The corrected application speed (i.e., the corrected moving speed when the discharge device is moved while discharging the liquid material) is calculated by dividing the length of the applied line (i.e., the length of the application pattern), which has been set in the first step, by the application time $T_2$ having been calculated in (3).

The second step and the third step are executed for all of the discharge devices 2a, 2b and 2c. In other words, the corrected moving speed for each of the discharge devices 2a, 2b and 2c is calculated by executing the second step and the third step in the same number of times as the number of discharge devices 2. The second step and the third step are preferably executed not only before the start of the application work, but also at a preset correction period. It is disclosed here that the correction period is set, by way of example, as time information or the number of substrates, that data being input by a user.

(Formation of Application Pattern)

Finally, as a fourth step, the application is performed by moving the discharge devices 2a, 2b and 2c relative to the application object 5 in accordance with the application pattern at the corrected application speed that has been calculated in the third step.

The discharge device 2 serving as the reference (i.e., one of the discharge devices 2a, 2b and 2c) is operated at the corrected application speed, which has been calculated in the third step, by using the first-direction main drive device 6 and the second-direction main drive device 7. In other words, with respect to the discharge device 2 serving as the reference, the second-direction auxiliary drive device 13 is not operated (or the second-direction auxiliary drive device 13 is not disposed). The discharge devices 2 other than that serving as the reference are each operated by using the first-direction main drive device 6, the second-direction main drive device 7, and the second-direction auxiliary drive device 13.

When the corrected moving speeds in the first direction (i.e., the X direction (denoted by sign 9)), calculated in the third step, are different among the discharge devices, the discharge devices 2a, 2b and 2c are moved at the different moving speeds by operating the first-direction main drive devices 6a, 6b and 6c independently. When the corrected moving speeds in the second direction (i.e., the Y direction (denoted by sign 10)), calculated in the third step, are different among the discharge devices, the different moving speeds are obtained by executing the operation of the second-direction main drive device 7 and the operation of the second-direction auxiliary drive device 13 in a combined manner. In other words, the second-direction main drive device 7 is operated at the corrected moving speed of the discharge device 2 serving as the reference, and the second-direction auxiliary drive device 13 is operated at a differential speed relative to the corrected moving speed of the discharge device 2 serving as the reference. For instance, when the corrected moving speed of the discharge device 2b or 2c, calculated in the third step, is higher than that of the discharge device 2a serving as the reference, the second-direction auxiliary drive device 13b or 13c is operated in the same direction (denoted by sign 15) as the second-direction main drive device 7. As a result, the moving speed of the second-direction main drive device 7 and the moving speed of the second-direction auxiliary drive device 13b or 13c are summed, whereby the discharge device 2b or 2c can be moved faster than the discharge device 2a serving as the reference.

Conversely, when the corrected moving speed of the discharge device 2b or 2c, calculated in the third step, is lower than that of the discharge device 2a serving as the reference, the second-direction auxiliary drive device 13b or 13c is operated in the opposite direction (denoted by sign 15) to the second-direction main drive device 7. As a result, the corrected moving speed of the second-direction auxiliary drive device 13b or 13c is subtracted from the corrected moving speed of the second-direction main drive device 7, whereby the discharge device 2b or 2c can be moved slower than the discharge device 2a serving as the reference.

Table 1 indicates calculation examples of the corrected moving speeds of the discharge devices 2a, 2b and 2c. The discharge time $T_1$ per discharge is given by the sum of ON time and OFF time in Table 1. A reciprocal of the discharge time $T_1$ per discharge represents a frequency (discharge frequency). It is to be noted that, because characteristics of change in the discharge amount when the discharge frequency is changed is nonlinear in many cases, the discharge frequency once set is preferably not changed during the process for same application pattern.

TABLE 1

|  |  | Discharge Device 2a | Discharge Device 2b | Discharge Device 2c |
|---|---|---|---|---|
| Initial Setting | ON time [msec] |  | 2 |  |
|  | OFF time [msec] |  | 3 |  |
|  | Frequency [Hz] |  | 200 |  |
|  | Application Pattern Length [mm] |  | 16 |  |
|  | Applied Liquid Weight [mg] |  | 2 |  |
| Measurement of Discharged Liquid Weight | Preset Number of Discharges |  | 1000 |  |
|  | Measured Weight [mg] | 7.0 | 7.7 | 7.4 |
| Calculation of Corrected Application Conditions | Weight per Droplet [mg] | 0.0070 | 0.0077 | 0.0074 |
|  | Number of Discharges Required to Form Application Pattern | 286 | 260 | 270 |
|  | Application Time [sec] | 1.43 | 1.30 | 1.35 |
|  | Application Speed [mm/sec] | 11.2 | 12.3 | 11.9 |

Although, in this embodiment, the weight of the liquid material discharged in the preset number of discharges is measured in the second step, the weight of the liquid material when it is discharged during a preset time (i.e., the weight of the liquid material discharged in the preset time) may be measured unlike this embodiment. In such a case, the corrected moving speed for each of the discharge devices 2a, 2b and 2c is calculated in the third step in accordance with the following procedures.

(a) A discharge amount $W_1$ per unit time is calculated from the weight of the liquid material discharged in the preset time, which has been measured in the second step.

(b) A discharge amount $W_2$ per discharge (i.e., the weight of one droplet) is calculated by dividing the discharge amount $W_1$ per unit time, which has been calculated in (a), by the discharge frequency of the discharge device 2.

(c) The number S of discharges required to form one application pattern is calculated by dividing the weight of the liquid material (i.e., applied liquid weight $W_3$) required to form one application pattern, which has been set in the first step, by the discharge amount $W_2$ per discharge, which has been calculated in (b).

(d) A time (application time $T_2$) required to form one application pattern is calculated by dividing the number S of discharges required to form one application pattern, which has been calculated in (c), by the discharge frequency of the discharge device 2 determined from the discharge time $T_1$ per discharge, which has been set in the first step.

(e) A corrected application speed (i.e., the corrected moving speed when the discharge device is moved while discharging the liquid material) is calculated by dividing the length of the applied line (i.e., the length of the application pattern), which has been set in the first step, by the application time $T_2$ having been calculated in (d).

In the liquid material application apparatus 1 according to the first embodiment, as described above, the auxiliary drive devices are disposed in addition to the main drive device to move the discharge devices 2 relative to the application object 5, and the liquid material is applied under application conditions different among the discharge devices 2. Thus, even when similar operations are simultaneously performed by the plurality of discharge devices 2 having variations in the discharge amounts, the discharge amount (applied liquid weight) free from variations among the plurality of discharge devices can be obtained.

The discharge device 2 may be of another type different from that used in this embodiment. For instance, the discharge device 2 may be of an "air type" in which the liquid material is discharged from the discharge port by supplying compressed air to a container storing the liquid material, a "screw type" in which the liquid material is discharged from the discharge port by carrying the liquid material with rotation of a screw including a spiral blade that is formed on the surface of a rod-shaped member in an axial direction, or a "plunger type" in which the liquid material is filled into a metering hole by retracting a plunger held in slide contact with an inner wall of the metering hole, and the liquid material is discharged from the discharge port by advancing the plunger.

Second Embodiment

<Constitution>

Figure 2:
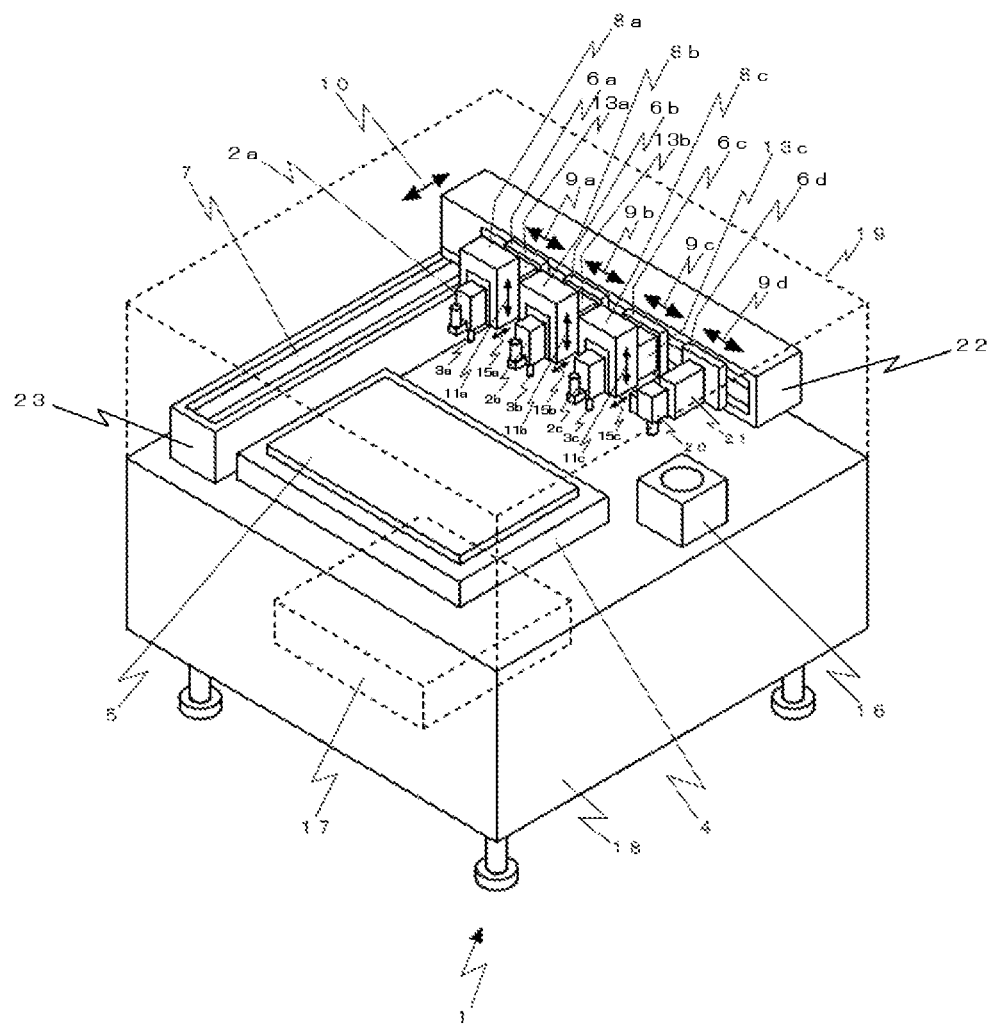
FIG. 2 is an overall perspective view of a liquid material application apparatus according to a second embodiment.

A liquid material application apparatus 1 according to a second embodiment, illustrated in FIG. 2, is mainly different from the liquid material application apparatus 1 according to the first embodiment in including an image capturing device 20, a distance measuring device 21, and a first-direction main drive device 6d for driving the image capturing device 20 and the distance measuring device 21. The following description is made mainly about the different points, and description of the common components is omitted.

The image capturing device 20 measures a position of the application object 5 relative to the discharge device 2 in each of the X direction (denoted by sign 9) and the Y direction (denoted by sign 10). The image capturing device 20 is preferably constituted by, for example, a CCD camera that is able to capture an image of the application object 5. The image capturing device 20 is coupled to a lateral surface of the distance measuring device 21 on the side facing the stage, and is connected to the control device 17 via a signal cable (not illustrated). The control device 17 executes, with the aid of dedicated software, the function of calculating a positional relation between the discharge device 2 and the application object 5 in a horizontal direction on the basis of images of alignment marks, the images being captured by the image capturing device 20.

The distance measuring device 21 measures a position of the application object 5 relative to the discharge device 2 in the Z direction (denoted by sign 11). The distance measuring device 21 is preferably constituted by, for example, a laser displacement meter that is able to measure a distance to the application object 5. The distance measuring device 21 is coupled to a lateral surface of the first-direction main drive device 6d on the side facing the stage, and is connected to the control device 17 via a signal cable (not illustrated). The control device 17 executes, with the aid of dedicated software, the function of calculating the distance between the discharge device 2 and the application object 5 on the basis of a signal received from the distance measuring device 21.

The second embodiment includes one image capturing device 20 and one distance measuring device 21. However, when the image of or the distance to the entire application range on the application object 5 cannot be captured or measured by one device, the image capturing device 20 and/or the distance measuring device 21 is disposed two or more to be able to cover the entire application range.

The distance measuring device 21 can be independently moved by the first-direction main drive device 6d in the X direction (denoted by sign 9). Although, in the second embodiment, the first-direction main drive device 6d is disposed at the right end of the beam 22, it may be disposed between adjacent two of the first-direction main drive devices 6a to 6c or at the left end of the beam 22. Although, in the second embodiment, the image capturing device 20 and the distance measuring device 21 are disposed side by side in the Y direction (denoted by sign 10), they may be disposed side by side in the X direction (denoted by sign 9). Because the image capturing device 20 and the distance measuring device 21 are intended to measure the position as a reference for correction, the second-direction auxiliary drive device is not disposed in association with them.

Moreover, although, in the second embodiment, the image capturing device 20 and the distance measuring device 21 are disposed on the first-direction main drive device 6d as an independent device, the image capturing device 20 and the distance measuring device 21 may be disposed side by side on any one of the first-direction main drive devices 6a to 6c together with the discharge device 2 without disposing the first-direction main drive device 6d. In such a case, the image capturing device 20 and the distance measuring device 21 are preferably disposed together with the discharge device 2 not including the second-direction auxiliary drive device. When they are disposed together with the discharge device 2 including the second-direction auxiliary drive device, the second-direction auxiliary drive device is to be not operated during a measurement operation described later.

Because the other structure is similar to that of the liquid material application apparatus according to the first embodiment, description of the other structure is omitted.

The liquid material application apparatus 1 according to the second embodiment has the position correction function when the application object 5 is mounted in a deviated state.

In the case of the application object 5 being a rectangular plate-like member, for example, the application object 5 needs to be placed on the stage 4 such that sides of the application object 5 are exactly aligned with moving directions of the drive devices. Stated in another way, the application object 5 needs to be placed on the stage 4 such that the sides of the application object 5 are positioned exactly parallel or orthogonal to the moving directions of the drive devices. Actually, however, the application object 5 is placed in a translated or rotated state, i.e., in a "deviated" state, in most cases. Unless the application object 5 is accurately placed, the liquid material is not applied to an accurate position on the application object 5. Taking into account the above point, a "deviation" amount is measured and the application is performed in a way of correcting the deviation amount such that the liquid material can be applied to the accurate position.

Furthermore, in order to accurately apply the liquid material onto the application object 5, the spacing or the distance between the discharge device 2 and the application object 5 (namely, the height of the discharge device 2 relative to the application object 5) needs to be held appropriately. Actually, however, the surface of the application object 5 often varies in a height direction in an undulatory form due to force and heat given during transfer or upon mounting of components. When the application is performed on the surface in such a condition, the liquid material is not discharged in the accurate amount or not applied in the desired form in some cases. Taking into account the above point, the surface condition is measured and the application is performed in a way of correcting variations in the height direction such that the liquid material can be applied in the desired form.

<Operations>

The liquid material application apparatus 1 according to the second embodiment executes the following A step and B step instead of the fourth step in the first embodiment. Because first to third steps are similar to those in the first embodiment except for only the point given below, description of those steps is omitted. In the first step in this embodiment, coordinate and images of two alignment marks are set.

As the A step, a position of the discharge device 2 relative to the application object 5 is measured, and a position at which the discharge device 2 starts the discharge is calculated on the basis of a measured result. In this embodiment, the A step is executed as follows.

(1) The image capturing device 20 is moved to the coordinate of the alignment mark previously set in the first step, and an image of the alignment mark on the application object 5 is captured.

(2) Image processing is executed with the aid of dedicated software incorporated in the control device 17 to calculate a deviation amount between the image of the alignment mark previously set in the first step and the image of the alignment mark captured in (1), and a calculation result is stored in the storage device. Here, the deviation amount is calculated after capturing the image of each of two alignment marks away from each other on the application object 5. By using two alignment marks, position correction can be performed with respect to rotation.

(3) After moving the distance measuring device 21 to a measurement position, measurement is performed and a measured result (third-direction measured value) is stored in the storage device. The measurement position is preferably set to an application start position for each of application patterns to be formed by multi-piece processing. In the multi-piece processing, however, the number of measurement positions is so many. Time saving may be achieved by dividing an application surface of the application object 5 into a certain number of regions each of which includes plural ones among all the application patterns, by performing the measurement at one position in each region, and by using a measured value as a representative value. If accuracy of the application surface of the application object 5 can be judged as being sufficiently high, the measurement may be performed at only one position.

Then, as the B step, the application is performed on the basis of not only the corrected application speed calculated in the third step, but also the deviation amount calculated in the A step and the third-direction measured value measured in the A step. A method of performing the application in accordance with the corrected application speed is similar to that in the first embodiment. On the other hand, the application on the basis of the calculated deviation amount is performed by adding, to the application pattern set in the first step, the deviation amount calculated in the A step and the third-direction measured value measured in the A step.

The first to third steps and the A step are preferably executed each time the application object 5 is replaced.

Also with the above-described liquid material application apparatus 1 according to the second embodiment, even when similar operations are simultaneously performed by the plurality of discharge devices 2 having variations in the discharge amounts, the discharge amount (applied liquid weight) free from variations among the plurality of discharge devices can be obtained. In addition, since the position of the application object 5 relative to the discharge device 2 is measured, accuracy of the application position can be increased.

Third Embodiment

<Constitution>

Figure 3:
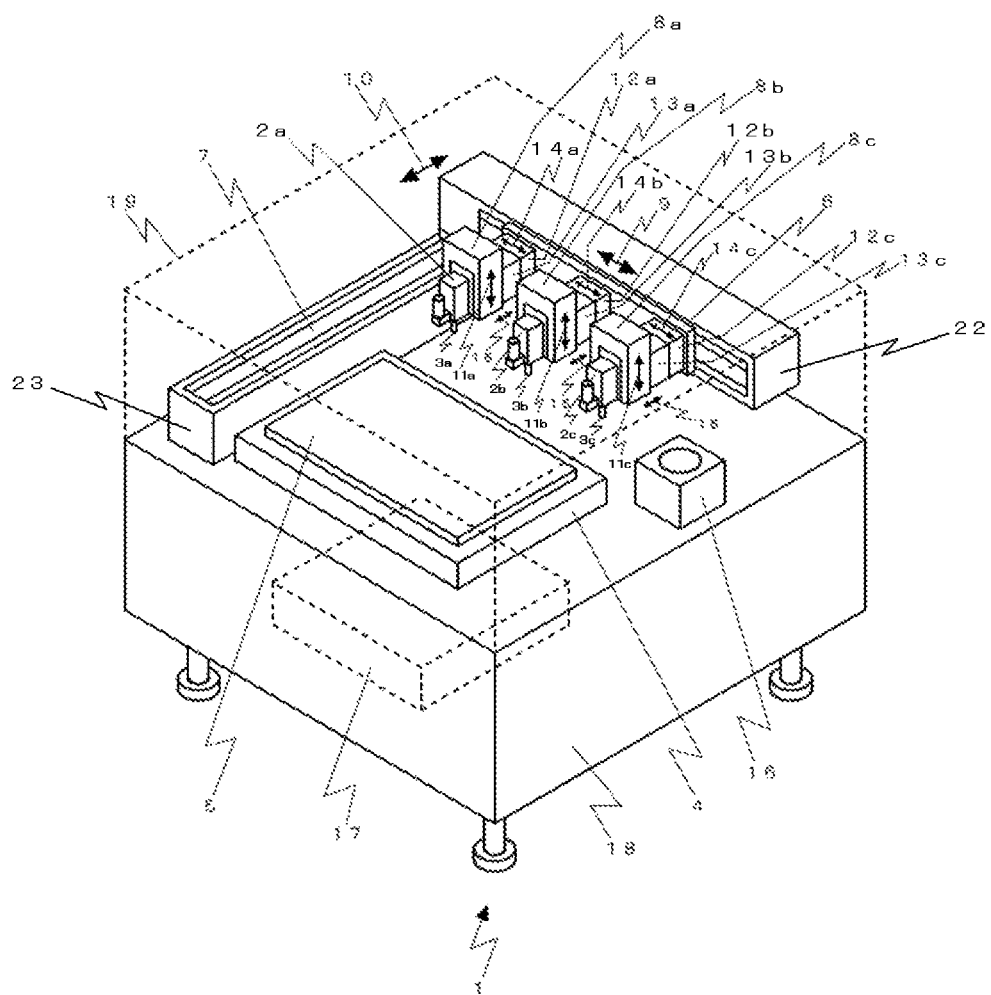
FIG. 3 is an overall perspective view of a liquid material application apparatus according to a third embodiment.

A liquid material application apparatus 1 according to a third embodiment, illustrated in FIG. 3, is different from that according to the first embodiment in constitution of a first-direction main drive device 6 and first-direction auxiliary drive devices 12a, 12b and 12c.

The first-direction main drive device 6 in the third embodiment includes a rectangular plate-like member on which the discharge devices 2a, 2b and 2c are disposed at predetermined intervals, and it is disposed on a lateral surface of the beam 22 on the side facing the stage. The first-direction main drive device 6 is constituted to be able to simultaneously move the discharge devices 2a, 2b and 2c in the X direction denoted by sign 9.

The first-direction auxiliary drive devices 12a, 12b and 12c are disposed on a lateral surface of the first-direction main drive device 6 on the side facing the stage, and they can move the discharge devices 2a, 2b and 2c independently in the X direction as denoted by signs 14a, 14b and 14c, respectively. Here, the movements in the X direction, denoted by signs 14a to 14c, can be performed independently of the movement performed by the first-direction main drive device 6 in the X direction (denoted by sign 9).

The second-direction auxiliary drive devices 13a, 13b and 13c are disposed respectively on lateral surfaces of the first-direction auxiliary drive devices 12a, 12b and 12c on the side facing the stage, and they can move independently the discharge devices 2a, 2b and 2c in the Y direction as denoted by numerals 15a to 15c, respectively.

Thus, according to this embodiment, the moving speeds of the discharge devices 2a, 2b and 2c can be individually controlled in the X direction (denoted by numerals 9 and 14) and the Y direction (denoted by numerals 10 and 15).

Because the other structure is similar to that of the liquid material application apparatus 1 according to the first embodiment, description of the other structure is omitted.

<Operations>

Operations of the liquid material application apparatus 1 according to the third embodiment are similar in the first to third steps to those of the liquid material application apparatus 1 according to the first embodiment, but an operation in the fourth step is different between the third embodiment and the first embodiment.

In the fourth step in the third embodiment, different moving speeds of the discharge devices 2a, 2b and 2c in the second direction (Y direction) are realized by combining the operations of the second-direction auxiliary drive devices 13a, 13b and 13c with the operation of the second-direction main drive device 7. Furthermore, in the third embodiment, different moving speeds of the discharge devices 2a, 2b and 2c in the first direction (X direction) are realized by combining the operations of the first-direction auxiliary drive devices 12a, 12b and 12c with the operation of the first-direction main drive device 6. Also in the third embodiment, movable distances of the auxiliary drive devices (12 and 13) are preferably set to be shorter than those of the main drive devices (6 and 7). It is also preferable, as in the first embodiment, that the auxiliary drive devices (12 and 13) are as small as possible because they constitute the application heads together with the discharge devices 2a, 2b and 2c. It is further preferable, as in the first embodiment, that with respect to the discharge device 2 serving as the reference in control of the moving speed, the corresponding first-direction auxiliary drive device 12 is not to be operated (or the first-direction auxiliary drive device 12 is not to be disposed).

As described above, the liquid material application apparatus 1 according to the third embodiment can also provide similar operation effects to those in the first embodiment. It is of course possible to add the image capturing device 20 and/or the distance measuring device 21 in the second embodiment to the liquid material application apparatus 1 according to the third embodiment.

Fourth Embodiment

<Constitution>

Figure 4:
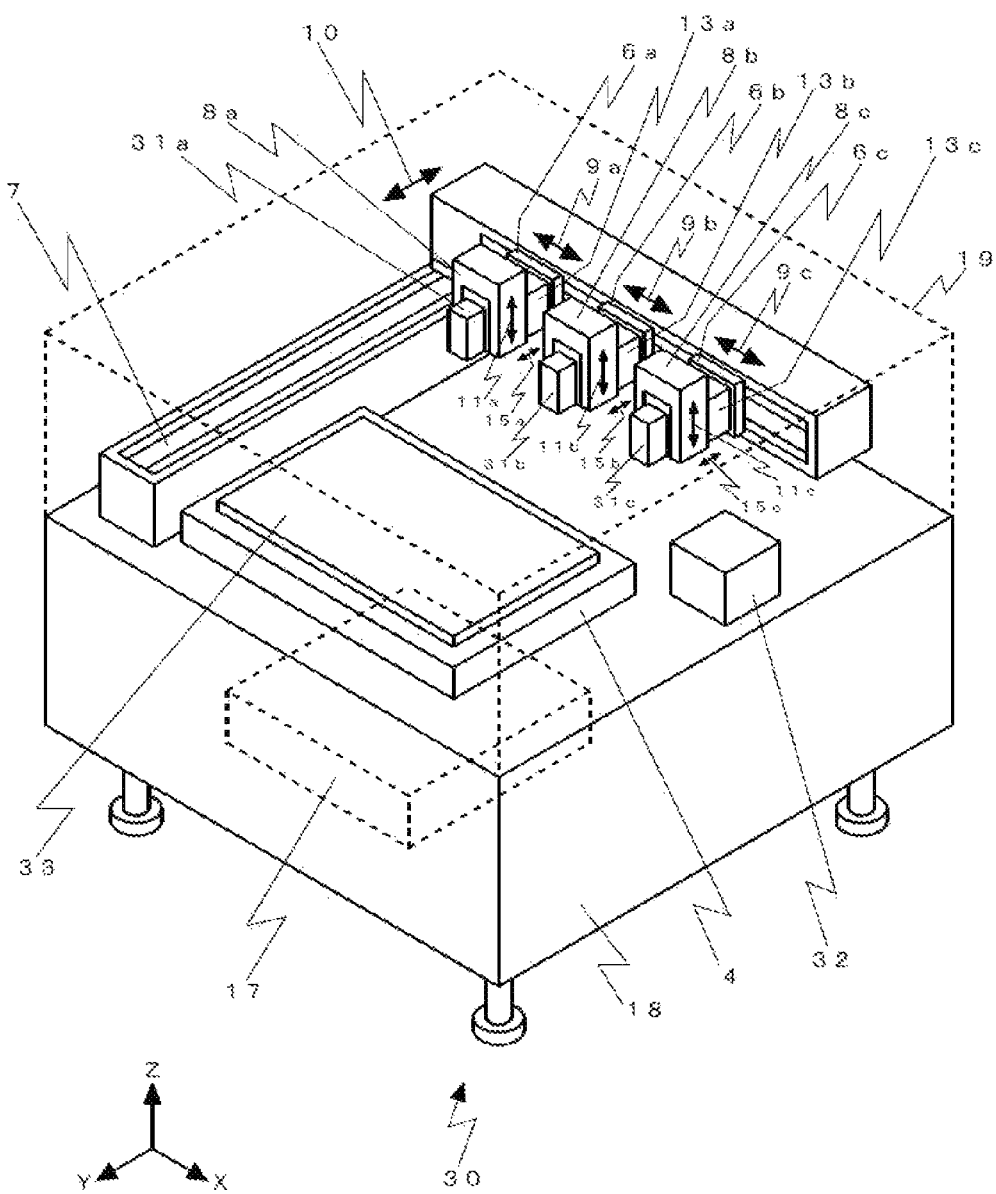
FIG. 4 is an overall perspective view of a liquid material application apparatus according to a fourth embodiment.

A laser processing apparatus 30 according to a fourth embodiment, illustrated in FIG. 4, is to form grooves and/or holes or to engrave characters and/or patterns in a processing object, or to cut the processing object into a plurality of individual pieces. The fourth embodiment is mainly different from the first embodiment in that laser oscillation devices (31a, 31b and 31c) are mounted instead of the discharge devices (2a, 2b and 2c) to the work heads, and that a laser output measurement device 32 is disposed as a work amount measurement device. A stage 4 on which the processing object 33 is placed, XYZ drive devices (6, 7, 8 and 13) driving the laser oscillation devices (31a, 31b and 31c) and the stage 4 relative to each other, the laser oscillation devices (31a, 31b and 31c), a bench 18 on which the above-mentioned various devices are disposed, and a cover 19 covering an upper space above the bench 18 are not different from those in the first embodiment. The following description is made mainly about the different points, and description of the common components is omitted. Furthermore, in the following description, the laser oscillation devices (31a, 31b and 31c) are simply expressed by the "laser oscillation devices 31" in some cases.

The laser oscillation device 31 in the fourth embodiment includes a laser source, such as a $CO_2$ laser or a YAG laser, which emits a laser beam in the pulsed form at a predetermined frequency. Also in the fourth embodiment, the plurality of laser oscillation devices 31 having the same specifications are disposed such that a plurality of processing patterns (work patterns) can be formed simultaneously as in the first embodiment. FIG. 4 illustrates the case that three laser oscillation devices 31 are disposed. However, the number of laser oscillation devices is not limited to three, and it may be two or four or more (e.g., any of 2 to 8). The number of laser oscillation devices is determined in consideration of the number and the size of processing patterns to be formed on the processing object.

The fourth embodiment includes the laser output measurement device 32 instead of the weight measurement device 16 in the liquid material application apparatus 1 according to the first embodiment. Because a result measured by the laser output measurement device 32 is used for control, the laser output measurement device 32 preferably has the function of outputting the measured result to an external device (e.g., the control device 17 in this embodiment) via a cable, etc. The laser output measurement device 32 may be a commercially available device. As in the first embodiment, the control device 17 includes a processing device, a storage device, an input device, and an output device, and controls the operations of the laser oscillation devices (31a, 31b and 31c), the laser output measurement device 32, and the XYZ drive devices (6, 7, 8 and 13). Dedicated software for calculating a corrected moving speed, described later, is installed in the storage device of the control device 17, and it calculates the corrected moving speed on the basis of the measured result received from the laser output measurement device 32.

<Operations>

(Initial Setting)

At the outset, as a first step, various parameters are input through the input device and are stored in the storage device. The various parameters are related to the processing object 33, the laser oscillation device 31, and processing work. The parameters related to the processing object 33 are the dimensions of the processing object 33 itself, the number of multiple pieces formed in the processing object 33 (namely the number of multiple pieces arrayed in lengthwise and widthwise directions), the coordinates and images of alignment marks serving as reference positions in execution of the processing work, etc. The parameters related to the laser oscillation device 31 are the oscillation frequency of a laser beam, etc. The parameters related to the laser oscillation device 31 are input for all of the plurality of laser oscillation devices (31a, 31b and 31c). The parameters related to the processing work are the length and the shape (i.e., the processing pattern) of, for example, each groove to be processed, the laser output required to form one processing pattern, etc.

(Measurement of Laser Output)

Then, as a second step, the laser output for each of the laser oscillation devices (31a, 31b and 31c) is measured. The laser output measured in the fourth embodiment is obtained as a value measured by laser output measurement device 32 when the laser oscillation device 31 performs laser oscillation for a predetermined time set in advance (e.g., a preset time of 5 sec or 10 sec) (namely, it is obtained as the laser output during oscillation for the preset time). That measurement is executed under condition that the laser oscillation device 31 oscillates the laser beam for the predetermined time at a position above the laser output measurement device 32. The measured value is sent to the control device 17 and is stored in the storage device with the aid of dedicated software incorporated in the control device 17.

(Calculation of Corrected Moving Speed)

Then, as a third step, a corrected moving speed for each of the laser oscillation devices (31a, 31b and 31c) is calculated on the basis of a measured result of the laser output that has been measured in the second step. In the fourth embodiment, the calculation is performed in accordance with the following procedures. The following procedures can be executed using dedicated software incorporated in the control device 17.

(1) The laser output per unit time is calculated by dividing the laser output during the oscillation for the preset time, which has been measured in the second step, by the preset time that has been used in the second step.

(2) A time required to form one processing pattern is calculated by dividing the laser output required to form one processing pattern, which has been set in the first step, by the laser output per unit time, which has been calculated in (1).

(3) The corrected moving speed (i.e., the corrected moving speed when the laser oscillation device is moved while oscillating the laser beam) is calculated by dividing the length of the processed groove, for example, (i.e., the length of the processing pattern), which has been set in the first step, by the time having been calculated in (2).

The second step and the third step are executed for all of the laser oscillation devices ($31a$, $31b$ and $31c$). In other words, the corrected moving speed for each of the laser oscillation devices ($31a$, $31b$ and $31c$) is calculated by executing the second step and the third step in the same number of times as the number of laser oscillation devices 31. The second step and the third step are preferably executed not only before the start of the processing work, but also at a preset correction period. It is disclosed here that the correction period is set, by way of example, as time information or the number of processing objects 33, that data being input by a user.

(Formation of Processing Pattern)

Finally, as a fourth step, the processing work is performed by moving the laser oscillation devices ($31a$, $31b$ and $31c$) relative to the processing object 33 in accordance with the processing pattern at the corrected moving speed that has been calculated in the third step.

The laser oscillation device 31 serving as the reference (i.e., one of the laser oscillation devices ($31a$, $31b$ and $31c$)) is operated at the corrected moving speed, which has been calculated in the third step, by using the first-direction main drive device 6 and the second-direction main drive device 7. In other words, with respect to the laser oscillation device 31 serving as the reference, the second-direction auxiliary drive device 13 is not operated (or the second-direction auxiliary drive device 13 is not disposed). The laser oscillation devices 31 other than that serving as the reference are each operated by using the first-direction main drive device 6, the second-direction main drive device 7, and the second-direction auxiliary drive device 13. (Because operations of the laser oscillation devices 31 other than that serving as the reference are similar to those in the first embodiment, description of those operations is omitted. See the description of the first embodiment.)

With the laser processing apparatus 30 according to the fourth embodiment, as described above, the auxiliary drive devices are provided separately from the main drive device to move the laser oscillation devices 31 relative to the processing object 33 and to process the processing object 33 under different processing conditions. Thus, even when similar operations are simultaneously performed by the plurality of laser oscillation devices 31 having variations in the "output", the output result free from variations among the plurality of laser oscillation devices can be obtained.

While the present invention has been described in detail, by way of example, in connection with the several embodiments, the embodiments can be variously modified without substantially departing from the scope of the novel teaching and the advantageous effects of the present invention.

For instance, unlike the above embodiments, a cutter for cutting a work object by rotating a disk-shaped blade with a motor or the like may be mounted to the work head. In such a case, the torque or the number of rotations of the motor is used as an output to be controlled, and a correction amount is calculated by measuring the output from each work head.

LIST OF REFERENCE SIGNS

1: liquid material application apparatus, 2: discharge device, 3: discharge port, 4: stage, 5: application object, 6: first-direction main drive device, 7: second-direction main drive device, 8: third-direction drive device, 9: main moving direction in X direction, 10: main moving direction in Y direction, 11: main moving direction in Z direction, 12: first-direction auxiliary drive device, 13: second-direction auxiliary drive device, 14: auxiliary moving direction in X direction, 15: auxiliary moving direction in Y direction, 16: weight measurement device, 17: control device, 18: bench, 19: cover, 20: image capturing device, 21: distance measuring device, 22: beam, 23: support stand, 30: laser processing apparatus, 31: laser oscillation device, 32: laser output measurement device, 33: processing object

The invention claimed is:

1. A working apparatus comprising:
   n number (where n is a natural number equal to 2 or greater) of work heads performing a same work, wherein the n number of work heads includes a reference work head;
   a stage retaining a work object;
   a first-direction drive device moving the stage and the n number of work heads relative to each other in a first direction;
   a second-direction drive device moving the stage and the n number of work heads relative to each other in a second direction orthogonal to the first direction;
   a third-direction drive device moving the stage and the n number of work heads relative to each other in a third direction orthogonal to both the first direction and the second direction;
   a work amount measurement device measuring a work amount of each work head; and
   a control device configured to control operations of the n number of work heads and the first- to third-direction drive devices,
   wherein the first-direction drive device enables the n number of work heads to be independently moved in the first direction, and
   the second-direction drive device includes a second-direction main drive device moving the n number of work heads simultaneously in the second direction, and a second-direction auxiliary drive device moving the work heads among the n number of work heads independently in the second direction while the second-direction auxiliary drive device does not move the reference work head in the second direction.

2. The working apparatus according to claim 1, wherein a distance through which the second-direction auxiliary drive device is movable is not more than half of a distance L through which the second-direction main drive device is movable.

3. The working apparatus according to claim 1, wherein a distance through which the second-direction auxiliary drive device is movable is not more than ⅕ of a distance L through which the second-direction main drive device is movable.

4. The working apparatus according to claim 1, wherein the first-direction drive device includes a first-direction main drive device moving the n number of discharge devices simultaneously in the first direction, and a first-direction auxiliary drive device moving the work heads among the n number of work heads independently in the first direction.

5. The working apparatus according to claim 1, wherein the first-direction drive device is constituted by n number of first-direction main drive devices moving the n number of work heads independently in the first direction in a one-to-one relation.

6. The working apparatus according to claim 1, wherein, in a process of controlling the n number of work heads to operate in a same work pattern, the control device has function of setting a number of operations, a working time, and a working speed for each of the n number of work heads.

7. The working apparatus according to claim 6, wherein, in the process of controlling the n number of work heads to operate in the same work pattern, the control device has function of calculating and setting the number of operations, the working time, and the working speed for each of the n number of work heads on the basis of a value measured by the work amount measurement device for each of the n number of work heads.

8. The working apparatus according to claim 7, wherein, in the process of controlling the n number of work heads to operate in the same work pattern, the control device has function of calculating and setting the number of operations, the working time, and the working speed for each of the n number of work heads without changing an operation frequency.

9. A working method of forming n×m number (where m is a natural number equal to 1 or more) of work patterns on the work object by using the working apparatus according to claim 8,
wherein the work heads are each a work head mounting a discharge device that discharges a liquid material from a discharge port, and
wherein the working method comprises:
a number-of-discharges calculation step of calculating, on the basis of weight of one droplet discharged by each of the n number of work heads, a number of discharges required to form one work pattern for each of the n number of work heads;
an application time calculation step of calculating, on the basis of the calculated number of discharges required to form the one work pattern, a time required to form the one work pattern for each of the n number of work heads;
a corrected moving speed calculation step of calculating, on the basis of the calculated time required to form the one work pattern, a corrected moving speed for each of the n number of work heads; and
an application step of applying the liquid material while moving the n number of work heads and the work object relative to each other in accordance with the corrected moving speeds having been calculated.

10. The working method according to claim 9, wherein the n number of work heads are moved at different moving speeds in the application step by combining operation of the second-direction main drive device and operation of the second-direction auxiliary drive device with each other.

11. The working method according to claim 9, wherein n×p number (where p is a natural number equal to 2 or more) of arrayed work patterns are formed on the work object.

12. The working apparatus according to claim 1, further comprising an image capturing device mounted in association with each of the first-direction drive device and the second-direction drive device,
wherein the control device has function of calculating positional relations between the n number of work heads and the work object in the first direction and the second direction on the basis of images captured by the image capturing device, and setting work start positions of the n number of work heads in the first direction and the second direction on the basis of results of the calculation.

13. The working apparatus according to claim 12, further comprising a distance measuring device mounted in association with each of the first-direction drive device and the second-direction drive device,
wherein the control device has function of calculating a distance between each of the n number of work heads and the work object on the basis of a signal received from the distance measuring device, and setting a work start position of the work head in the third direction on the basis of a result of the calculation.

14. A working method of forming work patterns, which are m time(s) (where m is a natural number equal to 1 or more) the number of work heads, on the work object by using the working apparatus according to claim 12,
wherein the work heads are each a work head mounting a discharge device that discharges a liquid material from a discharge port, and
wherein the working method comprises:
a number-of-discharges calculation step of calculating, on the basis of weight of one droplet discharged by each of the n number of work heads, a number of discharges required to form one work pattern for each of the n number of work heads;
an application time calculation step of calculating, on the basis of the calculated number of discharges required to form the one work pattern, a time required to form the one work pattern for each of the n number of work heads;
a corrected moving speed calculation step of calculating, on the basis of the calculated time required to form the one work pattern, a corrected moving speed for each of the n number of work heads;
a horizontal start position calculation step of calculating horizontal application start positions of the work heads; and
an application step of applying the liquid material while moving the n number of work heads and the work object relative to each other in accordance with the corrected moving speeds and the horizontal start positions both having been calculated.

15. The working apparatus according to claim 1, wherein the n number of work heads are each a work head mounting a discharge device that discharges a liquid material from a discharge port.

16. A working method using the working apparatus according to claim 1, the working method comprising steps of:
moving the n number of work heads independently in the first direction by the first-direction drive device;
moving the n number of work heads simultaneously in the second direction by the second-direction main drive device; and
moving the work heads among the n number of work heads independently in the second direction by the second-direction auxiliary drive device, thus performing work while the n number of work heads and the work object are moved relative to each other.

17. The working apparatus according to claim 1, wherein each of the n number of work heads other than that serving as the reference work head is provided with the second-direction auxiliary drive device respectively, and the reference work head is not provided with the second-direction auxiliary drive device.

18. The working apparatus according to claim 1, wherein the work amount measurement device is a weight measurement device.

19. The working apparatus according to claim 1, wherein the work amount measurement device is a laser output measurement device.

20. The working apparatus according to claim 1, the second-direction auxiliary drive device is disposed on a lateral surface of the first-direction drive device.

* * * * *

UNITED STATES PATENT AND TRADEMARK OFFICE
CERTIFICATE OF CORRECTION

PATENT NO. : 11,229,923 B2  
APPLICATION NO. : 16/331688  
DATED : January 25, 2022  
INVENTOR(S) : Kazumasa Ikushima Page 1 of 1

It is certified that error appears in the above-identified patent and that said Letters Patent is hereby corrected as shown below:

On the Title Page

Column 1, item (87), Change:  
(87) PCT Pub. No.: WO2017/062463  
To be:  
(87) PCT Pub. No.: WO2018/062463

Signed and Sealed this  
Seventeenth Day of May, 2022

Katherine Kelly Vidal  
*Director of the United States Patent and Trademark Office*